United States Patent
Gustavsson et al.

(10) Patent No.: US 12,405,622 B2
(45) Date of Patent: Sep. 2, 2025

(54) VOLTAGE DETECTOR IN DATA COMMUNICATION INTERFACE

(71) Applicant: QUALCOMM Incorporated, San Diego, CA (US)

(72) Inventors: Bengt Stefan Gustavsson, Rancho Santa Fe, CA (US); Louis Dominic Oliveira, San Diego, CA (US); Tomer Saraf, Jamaica Plain, MA (US); Robert John Littrell, Belmont, MA (US); Ganesh Kiran, San Diego, CA (US); William Wei-Ting Kuo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 85 days.

(21) Appl. No.: 18/498,927

(22) Filed: Oct. 31, 2023

(65) Prior Publication Data

US 2025/0028341 A1    Jan. 23, 2025

Related U.S. Application Data

(60) Provisional application No. 63/514,071, filed on Jul. 17, 2023.

(51) Int. Cl.
*G05F 1/56* (2006.01)
*G06F 1/10* (2006.01)
*H03K 5/125* (2006.01)
*H03K 5/24* (2006.01)

(52) U.S. Cl.
CPC ............... *G05F 1/56* (2013.01); *G06F 1/10* (2013.01); *H03K 5/125* (2013.01); *H03K 5/24* (2013.01)

(58) Field of Classification Search
CPC ... G05F 1/56; G06F 1/10; G06F 1/266; G06F 1/263; G06F 1/26; G06F 1/28; G06F 1/30; G06F 1/3215; G06F 1/32; G06F 1/3203; G06F 1/3221; G06F 1/3225; G06F 1/3218; G06F 1/3234; G06F 1/325; G06F 1/3296; H03K 5/125; H03K 5/24
See application file for complete search history.

(56) References Cited

U.S. PATENT DOCUMENTS

| | | | |
|---|---|---|---|
| 6,340,902 B1 * | 1/2002 | Kato | H03K 5/153 327/77 |
| 7,619,444 B1 | 11/2009 | Shaikh et al. | |
| 10,466,756 B2 * | 11/2019 | Fujimoto | G06F 13/4282 |
| 2010/0026363 A1 | 2/2010 | Shankar et al. | |
| 2011/0130110 A1 | 6/2011 | Aida et al. | |

OTHER PUBLICATIONS

International Search Report and Written Opinion—PCT/US2024/032995—ISA/EPO—Aug. 27, 2024.

* cited by examiner

*Primary Examiner* — Jung Kim
(74) *Attorney, Agent, or Firm* — Loza & Loza, LLP

(57) ABSTRACT

Mechanisms for detecting a voltage level on a data communication interface between a slave device and a host device are disclosed. Based on the detected voltage level, the slave device may respond to the host device on the data communication interface at the detected voltage level. The slave device may include a circuit configured to toggle between a first voltage level and a second voltage level to provide one of the first voltage level or the second voltage level corresponding to the detected voltage level on the data communication interface.

22 Claims, 9 Drawing Sheets

| Voltage | 1.8V clock (65%) | 1.8V clock (85%) | 1.2V clock (10%) | 1.2V clock (5%) |
|---|---|---|---|---|
| 2.2 | FALSE | FALSE | FALSE | FALSE |
| 2.15 | TRUE | TRUE | FALSE | FALSE |
| 2.1 | TRUE | TRUE | FALSE | FALSE |
| 2.05 | TRUE | TRUE | FALSE | FALSE |
| 2 | TRUE | TRUE | FALSE | FALSE |
| 1.95 | TRUE | TRUE | FALSE | FALSE |
| 1.9 | TRUE | TRUE | FALSE | FALSE |
| 1.85 | TRUE | TRUE | FALSE | FALSE |
| 1.8 | TRUE | TRUE | FALSE | FALSE |
| 1.75 | TRUE | TRUE | FALSE | FALSE |
| 1.7 | TRUE | TRUE | FALSE | FALSE |
| 1.65 | TRUE | TRUE | FALSE | FALSE |
| 1.6 | TRUE | TRUE | FALSE | FALSE |
| 1.55 | TRUE | TRUE | FALSE | FALSE |
| 1.5 | TRUE | TRUE | FALSE | FALSE |
| 1.45 | TRUE | TRUE | TRUE | FALSE |
| 1.4 | TRUE | TRUE | TRUE | FALSE |
| 1.35 | TRUE | FALSE | TRUE | FALSE |
| 1.3 | TRUE | FALSE | TRUE | TRUE |
| 1.25 | TRUE | FALSE | TRUE | TRUE |
| 1.2 | TRUE | FALSE | TRUE | TRUE |
| 1.15 | TRUE | FALSE | TRUE | TRUE |
| 1.1 | TRUE | FALSE | TRUE | TRUE |
| 1.05 | FALSE | FALSE | TRUE | TRUE |
| 1 | FALSE | FALSE | TRUE | TRUE |
| .95 | FALSE | FALSE | TRUE | TRUE |
| .9 | FALSE | FALSE | TRUE | TRUE |
| .85 | FALSE | FALSE | TRUE | TRUE |
| .8 | FALSE | FALSE | TRUE | TRUE |
| .75 | FALSE | FALSE | TRUE | TRUE |
| .7 | FALSE | FALSE | FALSE | FALSE |
| .65 | FALSE | FALSE | FALSE | FALSE |
| .6 | FALSE | FALSE | FALSE | FALSE |
| .55 | FALSE | FALSE | FALSE | FALSE |
| .5 | FALSE | FALSE | FALSE | FALSE |
| .45 | FALSE | FALSE | FALSE | FALSE |
| .4 | FALSE | FALSE | FALSE | FALSE |
| .35 | FALSE | FALSE | FALSE | FALSE |
| .3 | FALSE | FALSE | FALSE | FALSE |
| .25 | FALSE | FALSE | FALSE | FALSE |
| .2 | FALSE | FALSE | FALSE | FALSE |
| .15 | FALSE | FALSE | FALSE | FALSE |
| .1 | FALSE | FALSE | FALSE | FALSE |
| .5 | FALSE | FALSE | FALSE | FALSE |
| 0 | FALSE | FALSE | FALSE | FALSE |

FIG. 7

VOLTAGE DETECTOR IN DATA COMMUNICATION INTERFACE

CROSS-REFERENCE TO RELATED APPLICATIONS

The present Application for patent claims priority to pending U.S. Provisional Application No. 63/514,071, filed Jul. 17, 2023, and assigned to the assignee hereof and hereby expressly incorporated by reference herein as if fully set forth below and for all applicable purposes.

TECHNICAL FIELD

The technology discussed below relates generally to data communication interfaces, and more particularly, to data communication interfaces used to connect devices in audio-visual or multimedia systems.

INTRODUCTION

Electronic devices, including mobile communication devices, wearable computing devices such as smartwatches, and tablet computers support ever increasing functionalities and capabilities. Many electronic devices include internal microphones and speakers and may include connectors that enable the use of audiovisual equipment including headphones, external speakers, and the like. Communication may be provided through a digital interface defined by one or more standards. In one example, mobile communication devices may employ an interface that conforms to the SoundWire standard specified by the Mobile Industry Processor Interface (MIPI) Alliance. The SoundWire standard defines a multi-wire communication bus. In other examples, mobile communication devices may employ a digital microphone (DMIC) interface.

Demand for increased audiovisual capabilities continues to grow. For example, mobile communications devices may include video cameras and stereo microphones, which may be modified over time to improve performance. In another example, digital processing capabilities may permit an electronic device to implement sound decoders that can provide signals to drive more than two speakers. In these and other examples, improved communications capabilities are needed to enable processing circuits, controllers, coder-decoder (Codec) devices and other components to transmit audio data to multiple audio devices over a common communications bus.

BRIEF SUMMARY OF SOME EXAMPLES

The following presents a summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a form as a prelude to the more detailed description that is presented later.

In one example, an apparatus is provided. The apparatus includes a clock line voltage detector configured to detect a voltage level of a clock signal sent by a host device on a clock line of a data communication interface between the apparatus and the host device and a circuit configured to provide an output voltage on the data communication interface. The output voltage is at one of a first voltage level or a second voltage level corresponding to the detected voltage level.

Another example provides a method operable at a slave device. The method includes detecting a voltage level of a clock signal sent by a host device on a clock line of a data communication interface between the slave device and the host device and providing an output voltage on the data communication interface. The output voltage is at one of a first voltage level or a second voltage level corresponding to the detected voltage level.

Another example provides a slave device including means for detecting a voltage level of a clock signal sent by a host device on a clock line of a data communication interface between the slave device and the host device and means for providing an output voltage on the data communication interface. The output voltage is at one of a first voltage level or a second voltage level corresponding to the detected voltage level.

These and other aspects will become more fully understood upon a review of the detailed description, which follows. Other aspects, features, and examples will become apparent to those of ordinary skill in the art upon reviewing the following description of specific exemplary aspects in conjunction with the accompanying figures. While features may be discussed relative to certain examples and figures below, all examples can include one or more of the features discussed herein. In other words, while one or more examples may be discussed as having certain features, one or more of such features may also be used in accordance with the various examples discussed herein. Similarly, while examples may be discussed below as device, system, or method examples, it should be understood that such examples can be implemented in various devices, systems, and methods.

BRIEF DESCRIPTION OF THE DRAWINGS

FIG. 7 is a diagram illustrating an example of voltage ranges according to some aspects.

DETAILED DESCRIPTION

Figure 1:
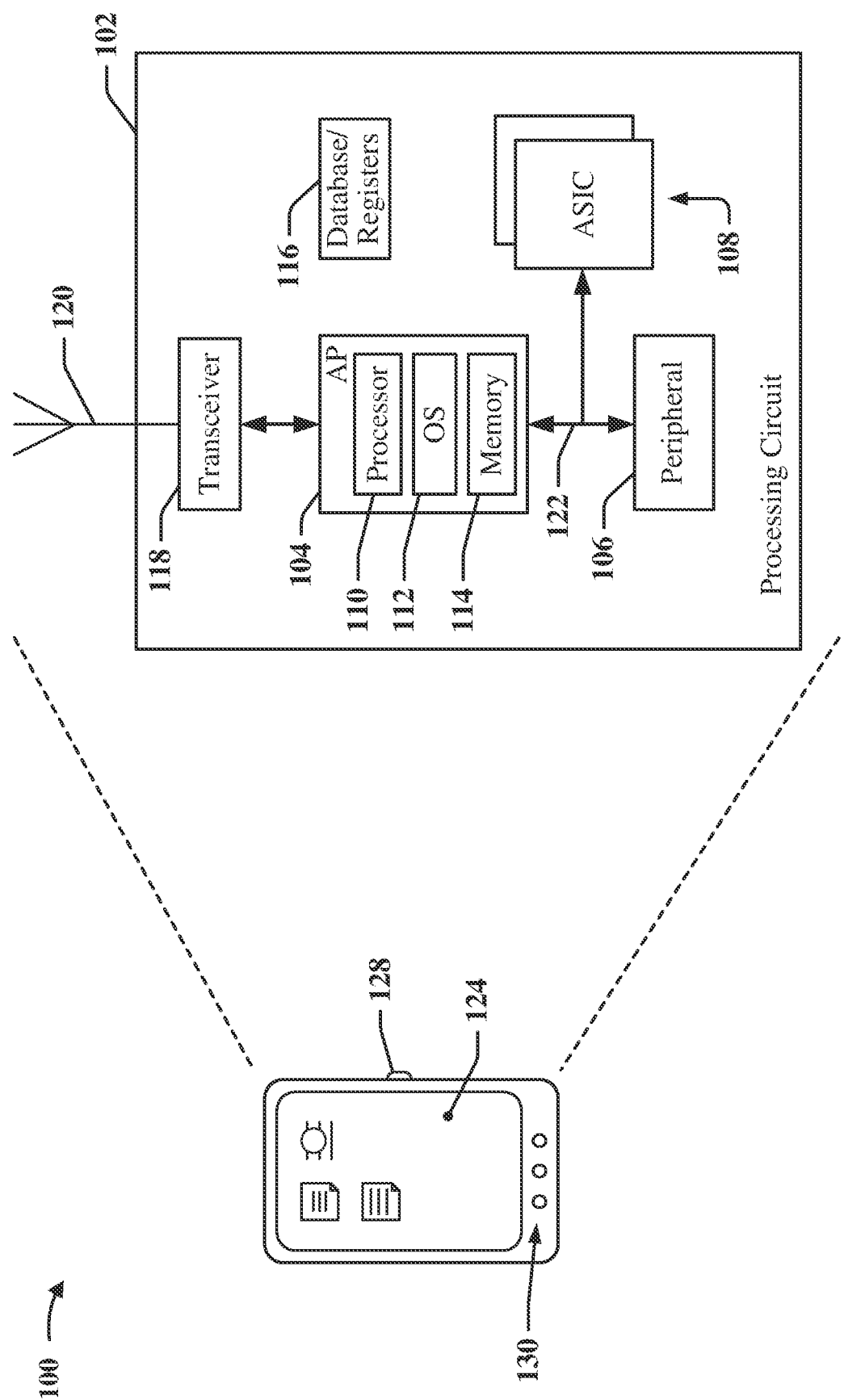
FIG. 1 is a diagram depicting an apparatus employing a data link between integrated circuit (IC) devices according to some aspects.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of the invention will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, firmware, or any combination thereof. Whether such elements are implemented as hardware or software depends upon the particular application and design constraints imposed on the overall system.

While aspects and examples are described in this application by illustration to some examples, those skilled in the art will understand that additional implementations and use cases may come about in many different arrangements and scenarios. Innovations described herein may be implemented across many differing platform types, devices, systems, shapes, sizes, and packaging arrangements. For example, aspects and/or uses may come about via integrated chip examples and other non-module-component-based devices (e.g., end-user devices, vehicles, communication devices, computing devices, industrial equipment, retail/purchasing devices, medical devices, artificial intelligence (AI)-enabled devices, etc.). While some examples may or may not be specifically directed to use cases or applications, a wide assortment of applicability of described innovations may occur. Implementations may range in spectrum from chip-level or modular components to non-modular, non-chip-level implementations and further to aggregate, distributed, or original equipment manufacturer (OEM) devices or systems incorporating one or more aspects of the described innovations. In some practical settings, devices incorporating described aspects and features may also necessarily include additional components and features for the implementation and practice of described examples. It is intended that innovations described herein may be practiced in a wide variety of devices, chip-level components, systems, distributed arrangements, end-user devices, etc., of varying sizes, shapes, and constitution.

A host device (e.g., a master device) may be coupled to a slave device (e.g., a sensor, such as a microphone) via a data communication interface (e.g., a bus). The data communication interface may be, for example, a single-ended bus with a clock line, a data line, and a ground. The clock line carries a clock signal supplied by the host. The data line may be either unidirectional (e.g., from the slave device to the host device) or bi-directional. In some examples, the data communication interface may be a Soundwire interface, a DMIC interface, a serial peripheral interface (SPI) or other suitable interface with a single-ended structure.

The data communication interface may operate at a 1.8 volt (V) supply or a 1.2 V supply. As the process geometries on host devices decrease, the number of 1.8 V input/output (I/O) supplies that may be supported by host devices may decrease. As a result, data communication interfaces between the host device and slave device(s) may increasingly be operated at 1.2 V supplies. However, slave devices, such as microphones or other types of sensors, may be pin-limited in the number of I/O supply pins that may be supported by the slave device. In addition, adding extra pins may prevent slave devices from maintaining backward compatibility and may increase the package complexity. Moreover, reducing the supply voltage from 1.8 V to 1.2 V may impact the performance of a slave device, thus limiting the ability of the slave device to reach key performance indicators (KPIs), such as the signal-to-noise ratio (SNR), distortion properties, and/or maximum signal level. However, generating a higher voltage (e.g., 1.8 V) internally within the slave device based on a lower supply voltage (e.g., 1.2 V) using, for example, a voltage doubler or switch gap, may increase the cost and size of the slave device.

Various aspects are related to mechanisms for a slave device to detect the voltage level on a data communication interface between the slave device and a host device. Based on the detected voltage level, the slave device may respond to the host device on the data communication interface at the detected voltage level. In some examples, the slave device may include a circuit, such as a low drop-out (LDO) regulator, Buck converter, voltage divider, or other suitable circuit, configured to toggle an output voltage of the circuit between a first voltage level and a second voltage level to provide an output voltage at one of the first voltage level or the second voltage level corresponding to the detected voltage level on the data communication interface. The first voltage level may correspond to 1.8 V and the second voltage level may correspond to 1.2 V.

In some examples, the slave device may be configured to measure the voltage level of a clock signal sent on the clock line. For example, the slave device may include a clock line voltage detector configured to measure (detect) the voltage level of the clock signal on the clock line. In an example, the clock line voltage detector may include a comparator configured to compare the clock line voltage with a threshold voltage to produce a comparator output indicative of the detected voltage level and a level shifter configured to produce a clock level signal based on the comparator output. The clock level signal may be input to the circuit to toggle the output voltage of the circuit between the first voltage level and the second voltage level.

In some examples, the threshold voltage may be set between the first voltage level and the second voltage level. For example, the threshold voltage may be set between 1.3 V and 1.4 V. In some examples, the slave device may further include a low pass filter configured to filter the clock signal and to provide a filtered clock signal to the comparator. The low pass filter may be included in the clock line voltage detector or may be external to the clock line voltage detector. In some examples, the low pass filter may include a cutoff frequency (−3 dB point) that is a few times higher than the highest clock rate to avoid false detections of the first voltage level (e.g., 1.8 V) by the comparator.

The circuit (e.g., an LDO regulator) may be coupled to an external power source providing a supply voltage at the first voltage level (e.g., 1.8 V). In examples in which the detected voltage level is the first voltage level, the LDO regulator may include a bypass switch to allow the first voltage level from the supply voltage to pass through the LDO regulator and be supplied to the data communication interface. In examples in which the detected voltage level is the second voltage level (e.g., 1.2 V), the LDO regulator may be configured to regulate the supply voltage down to the second voltage level (e.g., 1.2 V) and to provide the second voltage level to the data communication interface.

FIG. 1 is a diagram depicting an apparatus employing a data communication interface between integrated circuit (IC) devices according to some aspects. In one example, the apparatus 100 may include a radio communication device that communicates through a radio frequency (RF) communications transceiver 118 with a radio access network (RAN), a core access network, the Internet and/or another network. The communications transceiver 118 may be embodied in, or operably coupled to a processing circuit 102. The processing circuit 102 may be implemented using an SoC and/or may include one or more IC devices. In some examples, the processing circuit 102 may include one or more application processors 104, one or more ASICs 108, and one or more peripheral devices 106 such as Codecs, amplifiers and other audiovisual components. Each ASIC 108 may include one or more processing devices, logic circuits, storage, registers, and so on. An application processor 104 may include a processor 110 and memory 114, and may be controlled by an operating system 112 that is loaded from internal or external storage as data and instructions that are executable by the processor 110. The processing circuit 102 may include or access a local database 116 implemented in the memory 114, for example, where the database 116 can be used to maintain operational parameters and other information used to configure and operate the apparatus 100. The local database 116 may be implemented as a set of registers, or may be implemented in a database module, flash memory, magnetic media, non-volatile or persistent storage, optical media, tape, soft or hard disk, or the like. The processing circuit may also be operably coupled to internal and/or external devices such as an antenna 120, a display 124, operator controls, such as buttons 128, 130 and a keypad 126 among other components.

A data communication interface (e.g., bus) 122 may be provided to support communication between the application processor 104, ASICs 108 and/or the peripheral devices 106. The data communication interface 122 may be operated in accordance with standard protocols defined for interconnecting certain components of mobile devices. For example, there may be multiple types of interfaces defined for communications between an application processor and display and camera components of a mobile device, or between a Codec provided in an ASIC 108 and audio drivers in one of the peripheral devices 106. In some examples, the data communication interface 122 may conform to standards specified by the Mobile Industry Processor Interface (MIPI) Alliance. For example, the MIPI Alliance defines the SLIMbus and SoundWire interface standards that enable designers of mobile devices to achieve design goals including scalability, reduced power, lower pin count, case of integration, and consistency between system designs.

For example, a SoundWire data communication interface may allow up to eleven peripheral (e.g., slave) devices 106 to be connected to a host device (e.g., the application processor 104), where data may be driven from both the host and the slave devices according to a time division multiplexing (TDM) scheme. In other examples, the data communication interface 122 may correspond to a digital microphone (DMIC) interface that can be used to collect Pulse Density Modulation (PDM) audio data from the integrated analog-to-digital converters (ADCs) of one or two digital microphones. In still other examples, the data communication interface 122 may correspond to a serial peripheral interface (SPI) or other suitable interface with a single-ended structure in which a clock signal is driven from the host device.

Figure 2:
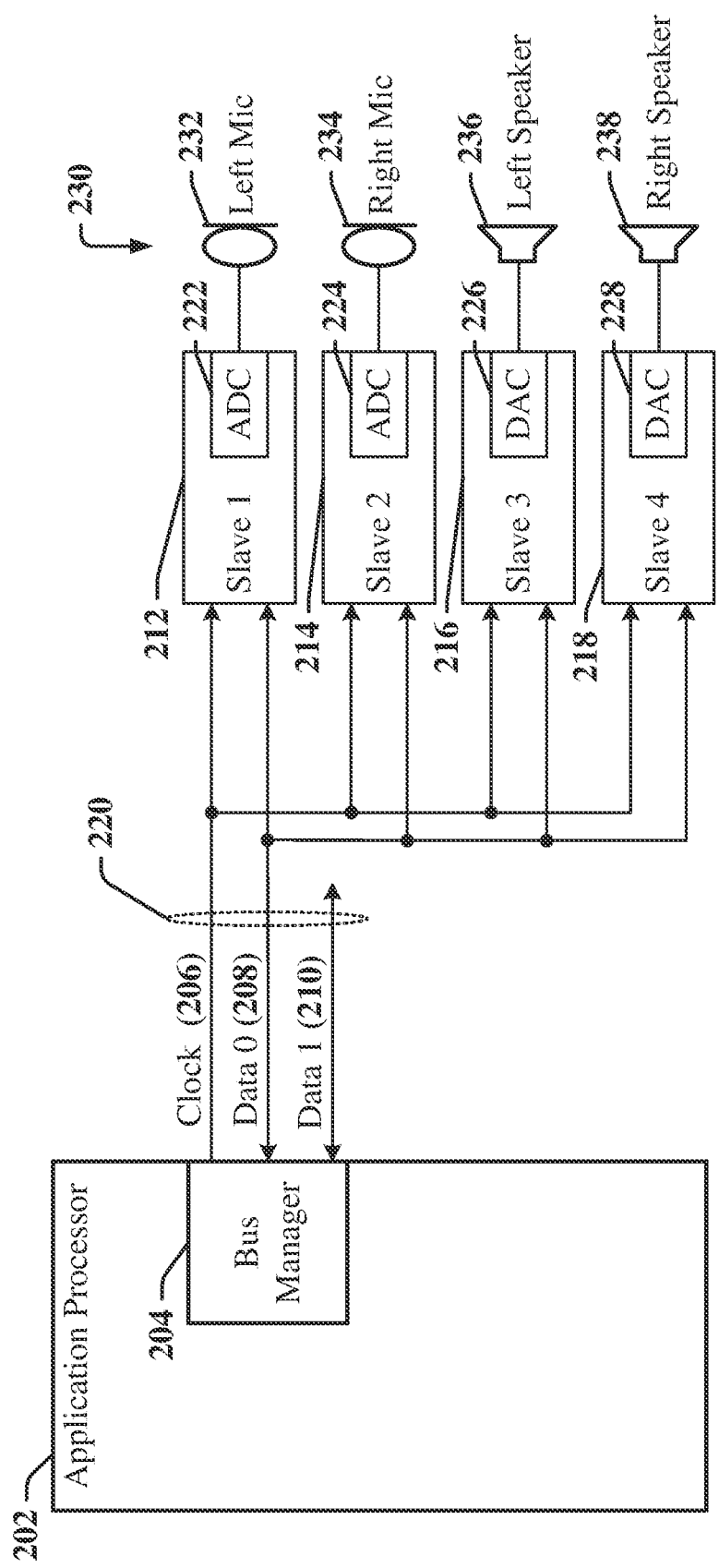
FIG. 2 is a diagram illustrating an example of an architecture for a data communication interface according to some aspects.

FIG. 2 illustrates an example of a SoundWire system according to some aspects. A variety of devices may be connected to a SoundWire data communication interface (e.g., a SoundWire bus), including audio headsets, Codecs, amplifiers, repeaters, switches, bridges, and signal processing devices. A system clock at 32 kHz may be distributed with minimal command and control. In the illustrated SoundWire system 200, an application processor 202 (e.g., host device), or other IC device, may include a Codec or be configured to operate as a Codec, and may be configured to communicate through a SoundWire bus manager 204. The SoundWire bus manager 204 may include lane (line) drivers and receivers, SoundWire encoders and decoders, a state machine and/or a sequencer, as well as other logic circuits. In some instances, the SoundWire bus manager 204 may be implemented in a Codec. The line drivers and receivers of the SoundWire bus manager 204 may be coupled to the wires of a data communication interface 220, referred to herein as a multi-wire bus 220, through designated terminals (pins) of the application processor 202.

In the illustrated example, the application processor 202 communicates with at least four slave devices 212, 214, 216, 218 that are associated with audio input/output devices 230. A first slave device 212 includes an analog-to-digital convertor (ADC 222) that digitizes input received from a left-side microphone 232, a second slave device 214 includes an ADC 224 that digitizes input received from a right-side microphone 234, a third slave device 216 includes a digital-to-analog convertor (DAC 226) that provides an output to drive a left-side loudspeaker 236, and a fourth slave device 218 includes an DAC 228 that provides an output to drive a right-side loudspeaker 238.

In the SoundWire system 200, the application processor 202 is coupled to the slave devices 212, 214, 216, 218 through the multi-wire bus 220. The multi-wire bus 220 may be configured to provide a clock line 206 and one or more data lines 208, 210. In practice, each data line 208, 210 is assigned to one of the physical wires of the multi-wire bus 220. The multi-wire bus 220 may be configured by the SoundWire bus manager 204. The SoundWire bus manager 204 may control data transport on up to eleven data lines 208, 210 of the multi-wire bus 220.

Figure 3:
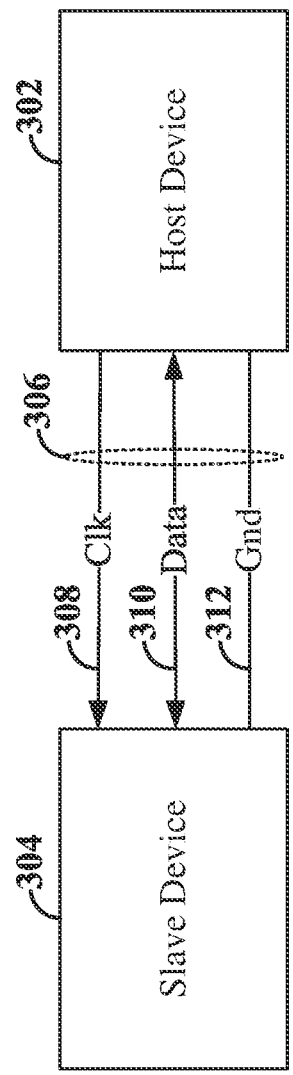
FIG. 3 is a diagram illustrating an example data communication interface according to some aspects.

FIG. 3 is a diagram illustrating an example data communication interface 306 according to some aspects. The data communication interface 306 shown in FIG. 3 is a single-ended bus between a host device 302 (e.g., a master device) and a slave device 304 (e.g., a sensor, such as a microphone). In some examples, the data communication interface 306 may be a Soundwire interface, a DMIC interface, a serial peripheral interface (SPI) or other suitable interface with a single-ended structure. The data communication interface 306 includes a clock line (Clk) 308, a data line (Data) 310, and ground (Gnd) 312. The clock line 308 carries a clock signal provided by the host device 302 to the slave device 304. For example, the clock signal may have a 50% duty cycle. The data line 310 may be a bi-directional data line, as shown in FIG. 3, or a unidirectional data line (e.g., from the slave device 304 to the host device 302).

The data communication interface 306 may operate at a 1.8 V supply or a 1.2 V supply. However, data communication interfaces 306 between the host device 302 and slave device 304 may increasingly be operated at 1.2 V supplies. In some examples, the slave device 304, such as a microphone or other types of sensor, may be pin-limited in the number of I/O supply pins that may be supported by the slave device. In addition, adding extra pins may prevent the slave device 304 from maintaining backward compatibility and may increase the package complexity. Moreover, reducing the supply voltage from 1.8 V to 1.2 V may impact the performance of the slave device 304. However, generating a higher voltage (e.g., 1.8 V) internally within the slave device 304 based on a lower supply voltage (e.g., 1.2 V) using, for example, a voltage doubler or switch cap, may increase the cost and size of the slave device.

Therefore, various aspects are related to mechanisms for a slave device to detect the voltage level on a data communication interface between the slave device and a host device. Based on the detected voltage level, the slave device may respond to the host device on the data communication interface at the detected voltage level.

Figure 4:
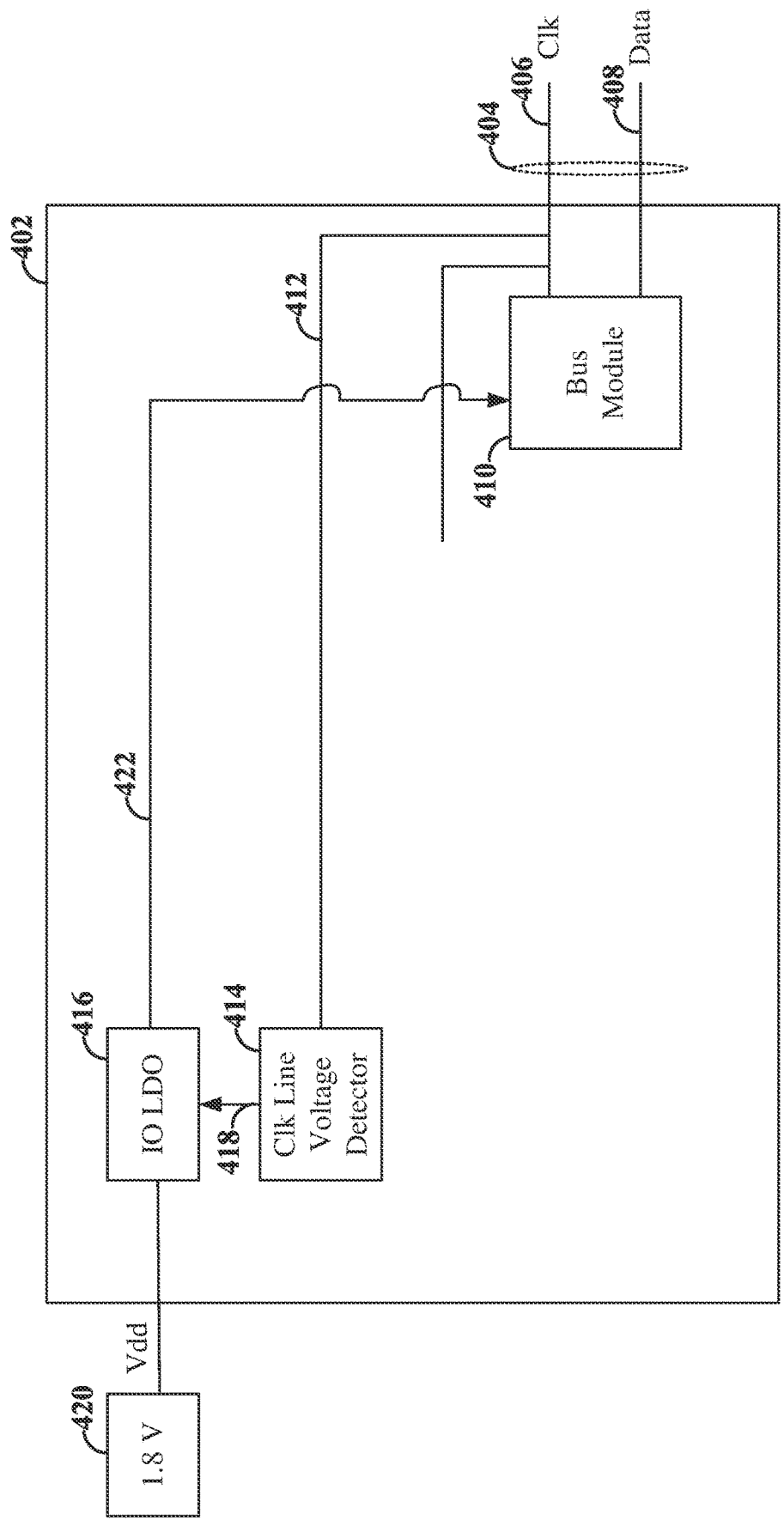
FIG. 4 is a diagram illustrating an example of an apparatus configured to detect the voltage level on a data communication interface according to some aspects.

FIG. 4 is a diagram illustrating an example of an apparatus 402 configured to detect the voltage level on a data communication interface 404 according to some aspects. The apparatus 402 may correspond, for example, to a slave device. For example, the slave device may include a microphone, a sensor, or other peripheral device. The data communication interface 404 may correspond, for example, to the data communication interface shown in FIGS. 2 and/or 3, and may include at least a clock line (Clk) 406 and a data line (Data) 408. The apparatus 402 includes a bus module 410 that may include, for example, line drivers and receivers, encoders and decoders, a state machine and/or a sequencer, as well as other logic circuits. The line drivers and receivers of the bus module 410 may be coupled to the wires of the data communication interface 404 through pins of the apparatus 402.

The apparatus 402 may further include a clock line voltage detector 414 that is configured to receive a clock signal 412 provided by the host device on the clock line 406. For example, upon the host device enabling the data communication interface 404 and initiating the clock signal 412 on the clock line 406, the clock signal 412 may be provided to the clock line voltage detector 414 to detect a voltage level of the clock signal 412. The voltage level may be, for example, 1.2 V or 1.8 V, depending on the supply voltage provided by the host device. For example, the clock line voltage detector 414 configured to measure (detect) the voltage level of the clock signal on the clock line to determine whether the detected voltage level is at a first voltage level (e.g., 1.8 V) or a second voltage level (e.g., 1.2 V).

The clock line voltage detector 414 may be configured to generate a clock level signal 418 indicative of the detected voltage level and to input the clock level signal 418 to a circuit 416, such as a Buck converter, voltage divider, or low drop-out (LDO) regulator, the latter being illustrated. The LDO regulator 416 may be configured to toggle an output voltage 422 of the LDO regulator 416 between the first voltage level and the second voltage level. The output voltage 422 may then be provided to the bus module 410 for output to the data communication interface 404. Therefore, based on the detected voltage level, the apparatus 402 may respond to the host device on the data communication interface 404 at the detected voltage level.

For example, the LDO regulator 416 may be coupled to an external power source 420 providing a supply voltage at the first voltage level (e.g., 1.8 V). In examples in which the clock level signal 418 indicates that the detected voltage level is the first voltage level, the LDO regulator 416 may include a bypass switch to allow the first voltage level from the supply voltage 420 to pass through the LDO regulator 416 and be supplied to the data communication interface 404 as the LDO output voltage 422. In examples in which the clock level signal 418 indicates that the detected voltage level is the second voltage level (e.g., 1.2 V), the LDO regulator 416 may be configured to regulate the supply voltage 420 down to the second voltage level (e.g., 1.2 V) and to provide the second voltage level as the output voltage 422 to the data communication interface 404. As a result, the apparatus 402 is able to communicate with the host device on the data communication interface 404 without requiring extra pins on the slave device or reducing the supply voltage 420 to the apparatus 402.

Figure 5:
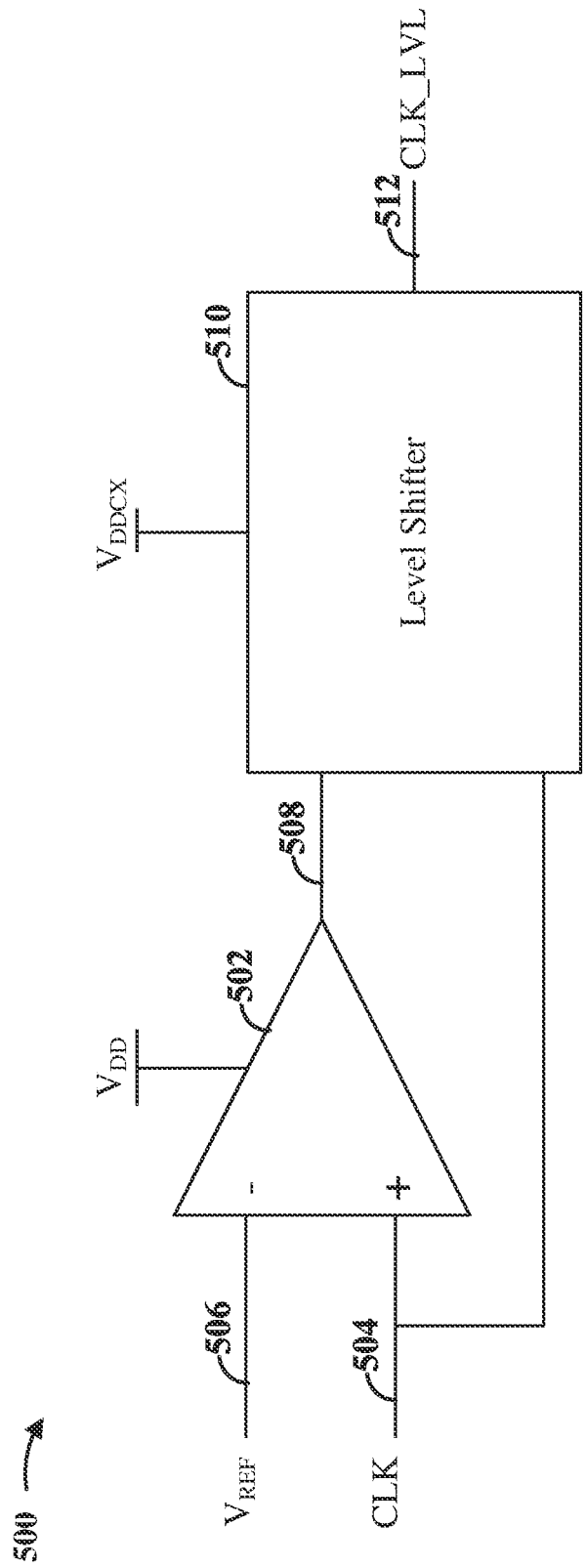
FIG. 5 is a diagram illustrating an example of a clock line voltage detector according to some aspects.

FIG. 5 is a diagram illustrating an example of a clock line voltage detector 500 according to some aspects. The clock line voltage detector 500 includes a comparator 502 configured to compare the clock line voltage of a clock line signal 504 (CLK) with a threshold voltage 506 ($V_{REF}$) to produce a comparator output 508 indicative of the detected voltage level. In some examples, the threshold voltage 506 may be set between a first voltage level (e.g., 1.8 V) and a second voltage level (e.g., 1.2 V). For example, the comparator 502 may be configured to compare the clock line voltage of the clock line signal 504 with the threshold voltage 506, and if the clock line voltage is greater than the threshold voltage, the comparator output may be high, whereas if the clock line voltage is less than the threshold voltage, the comparator output may be low. Other configurations of a clock line voltage detector 500 may be encompassed by the present application, and as such, the clock line voltage detector 500 is not limited to the use of a comparator 502 and threshold voltage 506 shown in FIG. 5 to detect the voltage level.

The clock line voltage detector 500 may further optionally include a level shifter 510 configured to generate a clock level signal 512 based on the comparator output 508. For example, the level shifter 510 may be configured to convert the comparator output 508 from the $V_{DD}$ domain to the $V_{DDCX}$ (a lower internal voltage) domain. The clock level signal 512 may be input to the LDO regulator to toggle the output of the LDO regulator between the first voltage level and the second voltage level. In some examples, the level shifter may not be included and the comparator output 508 may be input directly to the LDO regulator.

Figure 6:
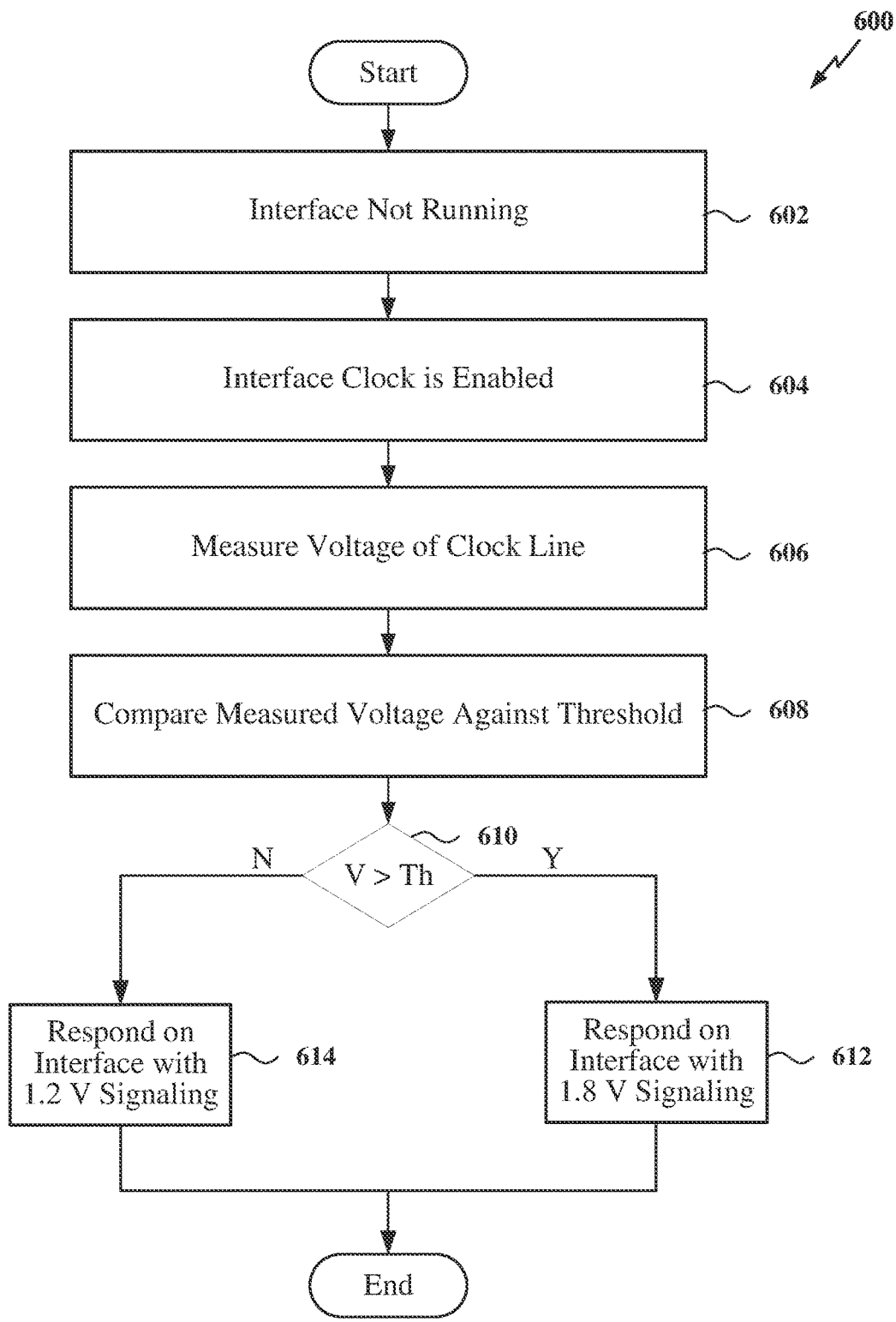
FIG. 6 is a flowchart illustrating an exemplary process for detecting the voltage on a data communication interface according to some aspects.

FIG. 6 is a flowchart illustrating an exemplary process for detecting the voltage on a data communication interface according to some aspects. As described below, some or all illustrated features may be omitted in a particular implementation within the scope of the present disclosure, and some illustrated features may not be required for implementation of all embodiments. In some examples, the process 600 may be carried out by the apparatus 402 illustrated in FIG. 4. In some examples, the process 600 may be carried out by any suitable apparatus or means for carrying out the functions or algorithm described below.

At block 602, the process begins with the data communication interface between the slave device and a host device not running (e.g., not being in operation). At block 604, the data communication interface clock is enabled at the slave device. For example, the host device may enable the clock line on the data communication interface and begin to send a clock signal to the slave device.

At block 606, the slave device measures the voltage level of the clock line. For example, the slave device may measure (detect) the voltage level of the clock signal received on the clock line to determine whether the detected voltage level is at a first voltage level (e.g., 1.8 V) or a second voltage level (e.g., 1.2 V). At block 608, the detected voltage level may be compared against a threshold (e.g., a voltage threshold). In some examples, the voltage threshold may be set between the first and second threshold levels (e.g., between 1.2 V and 1.8 V).

At block 610, a determination is made whether the detected voltage (V) is greater than the threshold (V>Th). If the detected voltage is greater than the threshold (Y branch of block 610), at block 612, the slave device may respond to the host device on the data communication interface with the first voltage level (e.g., 1. 8 V). However, if the detected voltage is less than the threshold (N branch of block 610), at block 614, the slave device may respond to the host device on the data communication interface with the second voltage level (e.g., 1.2 V).

FIG. 7 is a diagram illustrating an example of voltage ranges according to some aspects. For both 1.8 V and 1.2 V supplies, there is a range of voltages that may be acceptable within, for example, the DMIC and SoundWire specifications. For example, for a 1.8 V clock supply, as can be seen in the second column, the DMIC and Sound Wire specifications may allow voltages within 65% of IO to meet the standard for a 1.8 V supply. Thus, voltages between 1.1 V and 2.15 V may meet the standard for a 1.8 V supply. Similarly, for a 1.2 V clock supply, as can be seen in column four, the DMIC and SoundWire specifications may allow voltages within 10% of IO, and as such, voltages between 0.75 and 1.45 may meet the standard for a 1.2 V supply. As can be seen in FIG. 7, there is an overlap between the acceptable voltages for a 1.8 V supply and a 1.2 V supply. As a result, identifying a threshold voltage between the 1.8 V supply specification and the 1.2 V supply specification shown in FIG. 7 is not possible.

Therefore, in various aspects, the 1.8 V and 1.2 V specifications may be tightened (e.g., host and slave device implementations may be controlled in an improved manner as compared to the specifications) to enable a suitable threshold voltage to be ascertained. For example, as shown in FIG. 7, the 1.8 V clock supply specification may be tightened, as shown in column three, to allow voltages within 85% of IO to meet the standard. Thus, voltages between 1.4 V and 2.15 V may meet the standard for a 1.8 V supply. Similarly, for the 1.2 V clock supply, the specification may be tightened, as shown in column five, to allow voltages within 5% of IO to meet the standard. Thus, voltages between 0.75 V and 1.3 V may meet the standard for a 1.2 V supply. This leaves a gap between the 1.8 V and 1.2 V specifications, which allows a threshold voltage between 1.3 V and 1.4 V to be selected to detect the voltage level of the clock signal. To further prevent false voltage level detections, the clock signal may be low pass filtered prior to the comparator.

Figure 8:
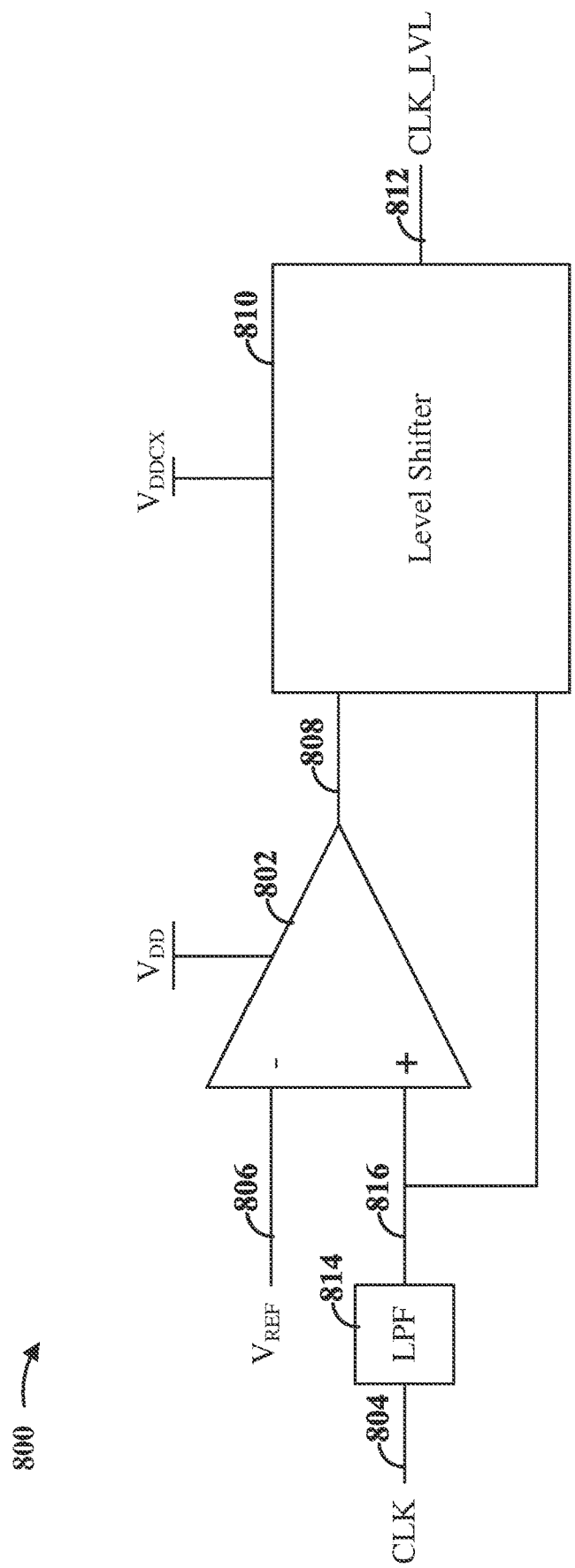
FIG. 8 is a diagram illustrating another example of a clock line voltage detector according to some aspects.

FIG. 8 is a diagram illustrating another example of a clock line voltage detector 800 according to some aspects. In the example shown in FIG. 8, the clock line voltage detector 800 may include a low pass filter 814 configured to low pass filter a clock line signal 804 (CLK) received on the clock line of a data communication interface and to produce a filtered clock signal 816. The clock line voltage detector 800 further includes a comparator 802 configured to compare the clock line voltage of the filtered clock signal 816 with a threshold voltage 806 ($V_{REF}$) to produce a comparator output 808 indicative of the detected voltage level. In some examples, the threshold voltage 806 may be set between a first voltage level (e.g., 1.8 V) and a second voltage level (e.g., 1.2 V). For example, the threshold voltage 806 may be set between 1.3 V and 1.4 V. In some examples, the low pass filter 814 may include a cutoff frequency (−3 dB point) that is a few times higher than the highest clock rate to avoid false detections of the first voltage level (e.g., 1.8 V) by the comparator 802. In an example, the comparator 802 may be configured to compare the clock line voltage of the filtered clock signal 816 with the threshold voltage 806, and if the clock line voltage is greater than the threshold voltage, the comparator output may be high, whereas if the clock line voltage is less than the threshold voltage, the comparator output may be low. It should be noted that other configurations of the clock line voltage detector 800 may be used instead of the comparator 802 and threshold voltage 806 shown in FIG. 8.

The clock line voltage detector 800 may further optionally include a level shifter 810 configured to generate a clock level signal 812 based on the comparator output 808. For example, the level shifter 810 may be configured to convert the comparator output 808 from the $V_{DD}$ domain to the $V_{DDCX}$ (a lower internal voltage) domain. The clock level signal 812 may be input to the LDO regulator to toggle the output of the LDO regulator between the first voltage level and the second voltage level. In some examples, the level shifter may not be included and the comparator output 808 may be input directly to the LDO regulator.

In some examples, the low pass filter 814 may be included in the clock line voltage detector 800, as shown in FIG. 8. In other examples, the low pass filter 814 may be external to the clock line voltage detector.

Figure 9:
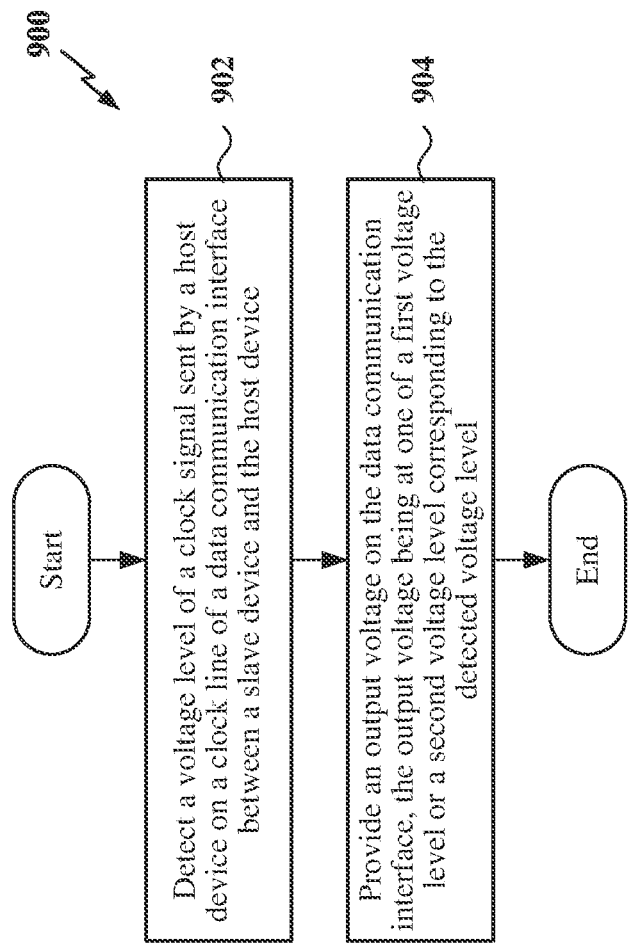
FIG. 9 is a flow chart illustrating another exemplary process for detecting the voltage on a data communication interface according to some aspects.

FIG. 9 is a flow chart illustrating another exemplary process 900 for detecting the voltage on a data communication interface according to some aspects. As described below, some or all illustrated features may be omitted in a particular implementation within the scope of the present disclosure, and some illustrated features may not be required for implementation of all embodiments. In some examples, the process 900 may be carried out by the apparatus 402 illustrated in FIG. 4. In some examples, the process 900 may be carried out by any suitable apparatus or means for carrying out the functions or algorithm described below.

At block 902, the process begins with a slave device detecting a voltage level of a clock signal sent by a host device on a clock line of a data communication interface between the slave device and the host device. For example, the clock line voltage detector 414 shown and described above in connection with FIG. 4 may provide a means to detect the voltage level.

At block 904, the slave device may provide an output voltage on the data communication interface. The output voltage may be at one of a first voltage level or a second voltage level corresponding to the detected voltage level. For example, the LDO regulator 416 (or other suitable circuit) shown and described above in connection with FIG. 4 may provide a means to provide the output voltage.

In some examples, the slave device may be configured to compare a clock line voltage of the clock signal with a threshold voltage to produce a comparator output indicative of the detected voltage level. In some examples, the first voltage level is 1.8 V and the second voltage level is 1.2 V. In some examples, the threshold voltage is between the first voltage level and the second voltage level. In some examples, the threshold voltage is between 1.3 V and 1.4 V.

In some examples, the slave device may further be configured to select one of the first voltage level or the second voltage level based on the comparator output. In some examples, the slave device may be configured to produce a clock level signal based on the comparator output and to select one of the first voltage level or the second voltage level based on the clock level signal. In some examples, the slave device is further configured to low pass filter the clock signal to produce a filtered clock signal. The slave device may further be configured to detect the voltage level of the filtered clock signal.

In some examples, the slave device may further be configured to receive a supply voltage at the first voltage level, to pass the supply voltage at the first voltage level as the output voltage in response to the detected voltage level being the first voltage level, and to regulate the supply voltage down to the second voltage level to provide the output voltage at the second voltage level to the data communication interface.

In one configuration, the slave device includes means for detecting a voltage level of a clock signal sent by a host device on a clock line of a data communication interface between the apparatus and the host device and means for providing an output voltage on the data communication interface, the output voltage being at one of a first voltage level or a second voltage level corresponding to the detected voltage level. In one aspect, the aforementioned means may be the clock line voltage detector and LDO regulator shown in FIG. 4 configured to perform the functions recited by the aforementioned means. In another aspect, the aforementioned means may be a circuit or any apparatus configured to perform the functions recited by the aforementioned means.

Of course, in the above examples, the circuitry included in the slave device 402 is merely provided as an example, and other means for carrying out the described functions may be included within various aspects of the present disclosure, including any other suitable apparatus or means described in any one of the FIGS. 1-5, 7, and/or 8, and utilizing, for example, the processes and/or algorithms described herein in relation to FIGS. 6 and/or 9.

Aspect 1: An apparatus, comprising: a clock line voltage detector configured to detect a voltage level of a clock signal sent by a host device on a clock line of a data communication interface between the apparatus and the host device; and a circuit configured to provide an output voltage on the data communication interface, the output voltage being at one of a first voltage level or a second voltage level corresponding to the detected voltage level.

The following provides an overview of aspects of the present disclosure:

Aspect 2: The apparatus of aspect 1, wherein the first voltage level is 1.8 V and the second voltage level is 1.2 V.

Aspect 3: The apparatus of aspect 1 or 2, wherein the clock line voltage detector comprises a comparator configured to compare a clock line voltage of the clock signal with a threshold voltage to produce a comparator output indicative of the detected voltage level.

Aspect 4: The apparatus of aspect 3, wherein the circuit is configured to receive the comparator output and to select the first voltage level or the second voltage level based on the comparator output.

Aspect 5: The apparatus of claim 3, wherein the clock line voltage detector further comprises a level shifter configured to produce a clock level signal based on the comparator output and to provide the clock level signal to the circuit.

Aspect 6: The apparatus of any of aspects 3, 4, or 5, further comprising: a low pass filter configured to filter the clock signal and to provide a filtered clock signal to the comparator.

Aspect 7: The apparatus of any of aspects 3 through 6, wherein the threshold voltage is between the first voltage level and the second voltage level.

Aspect 8: The apparatus of aspect 7, wherein the threshold voltage is between 1.3 V and 1.4 V.

Aspect 9: The apparatus of any of aspects 1 through 8, wherein the circuit comprises a low drop-out (LDO) regulator.

Aspect 10: The apparatus of aspect 9, wherein the LDO regulator is configured to receive a supply voltage at the first voltage level, to pass the supply voltage at the first voltage level through the LDO regulator as the output voltage in response to the detected voltage level being the first voltage level, and to regulate the supply voltage down to the second voltage level to provide the output voltage at the second voltage level to the data communication interface.

Aspect 11: A method operable at a slave device, the method comprising: detecting a voltage level of a clock signal sent by a host device on a clock line of a data communication interface between the slave device and the host device; and providing an output voltage on the data communication interface, the output voltage being at one of a first voltage level or a second voltage level corresponding to the detected voltage level.

Aspect 12: The method of aspect 11, wherein the first voltage level is 1.8 V and the second voltage level is 1.2 V.

Aspect 13: The method of aspect 11 or 12, further comprising: comparing a clock line voltage of the clock signal with a threshold voltage to produce a comparator output indicative of the detected voltage level.

Aspect 14: The method of aspect 13, further comprising: selecting the first voltage level or the second voltage level based on the comparator output.

Aspect 15: The method of aspect 13, further comprising: producing a clock level signal based on the comparator output; and selecting one of the first voltage level or the second voltage level based on the clock level signal.

Aspect 16: The method of any of aspects 13, 14, or 15, further comprising:
filtering the clock signal and to produce a filtered clock signal; and detecting the voltage level of the filtered clock signal.

Aspect 17: The method of any of aspects 13 through 16, wherein the threshold voltage is between the first voltage level and the second voltage level.

Aspect 18: The method of aspect 17, wherein the threshold voltage is between 1.3 V and 1.4 V.

Aspect 19: The method of any of aspects 11 through 18, further comprising:
receiving a supply voltage at the first voltage level; passing the supply voltage at the first voltage level as the output voltage in response to the detected voltage level being the first voltage level; and regulating the supply voltage down to the second voltage level to provide the output voltage at the second voltage level to the data communication interface.

Aspect 20: A slave device, comprising: means for detecting a voltage level of a clock signal sent by a host device on a clock line of a data communication interface between the slave device and the host device; and means for providing an output voltage on the data communication interface, the output voltage being at one of a first voltage level or a second voltage level corresponding to the detected voltage level.

Aspect 21: The slave device of aspect 20, wherein the first voltage level is 1.8 V and the second voltage level is 1.2 V.

Aspect 22: The slave device of aspect 20 or 21, further comprising: means for comparing a clock line voltage of the clock signal with a threshold voltage to produce a comparator output indicative of the detected voltage level.

Aspect 23: The slave device of aspect 22, further comprising: means for selecting the first voltage level or the second voltage level based on the comparator output.

Aspect 24: The slave device of aspect 22, further comprising: means for producing a clock level signal based on the comparator output; and means for selecting one of the first voltage level or the second voltage level based on the clock level signal.

Aspect 25: The slave device of aspect 22, 23, or 24, further comprising: means for filtering the clock signal and to produce a filtered clock signal; and means for detecting the voltage level of the filtered clock signal.

Aspect 26: The slave device of any of aspects 22 through 25, wherein the threshold voltage is between the first voltage level and the second voltage level.

Aspect 27: The slave device of aspect 26, wherein the threshold voltage is between 1.3 V and 1.4 V.

Aspect 28: The slave device of any of aspects 20 through 27, further comprising: means for receiving a supply voltage at the first voltage level; means for passing the supply voltage at the first voltage level as the output voltage in response to the detected voltage level being the first voltage level; and means for regulating the supply voltage down to the second voltage level to provide the output voltage at the second voltage level to the data communication interface.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-9 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-5 and/or 8 may be configured to perform one or more of the methods, features, or steps described herein. The novel algorithms described herein may also be efficiently implemented in software and/or embedded in hardware.

Any reference to an element herein using a designation e.g., "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112 (f) unless the element is expressly recited using the phrase "means for" or, in the case of a method claim, the element is recited using the phrase "step for."

What is claimed is:

1. An apparatus, comprising:
    a clock line voltage detector configured to detect a voltage level of a clock signal sent by a host device on a clock line of a data communication interface between the apparatus and the host device, wherein the voltage level comprises a first voltage level or a second voltage level, wherein the first voltage level is higher than the second voltage level, wherein the clock line voltage detector comprises:
        a comparator configured to compare a clock line voltage of the clock signal with a threshold voltage to produce a comparator output indicative of the detected voltage level; and
        a low pass filter configured to filter the clock signal and to provide a filtered clock signal to the comparator, wherein a cutoff frequency of the low pass filter is set to a multiple of the first voltage level to prevent false detection of the first voltage level by the comparator; and
    a circuit configured to provide an output voltage on the data communication interface, the output voltage being one of the first voltage level or the second voltage level corresponding to the detected voltage level.

2. The apparatus of claim 1, wherein the first voltage level is 1.8 V and the second voltage level is 1.2 V.

3. The apparatus of claim 1, wherein the circuit is configured to receive the comparator output and to select the first voltage level or the second voltage level based on the comparator output.

4. The apparatus of claim 1, wherein the clock line voltage detector further comprises a level shifter configured to produce a clock level signal based on the comparator output and to provide the clock level signal to the circuit.

5. The apparatus of claim 1, wherein the threshold voltage is between the first voltage level and the second voltage level.

6. The apparatus of claim 5, wherein the threshold voltage is between 1.3 V and 1.4 V.

7. The apparatus of claim 1, wherein the circuit comprises a low drop-out (LDO) regulator.

8. The apparatus of claim 7, wherein the LDO regulator is configured to receive a supply voltage at the first voltage level, to pass the supply voltage at the first voltage level through the LDO regulator as the output voltage in response to the detected voltage level being the first voltage level, and to regulate the supply voltage down to the second voltage level to provide the output voltage at the second voltage level to the data communication interface.

9. A method operable at a slave device, the method comprising:
   detecting a voltage level of a clock signal sent by a host device on a clock line of a data communication interface between the slave device and the host device, wherein the voltage level comprises a first voltage level or a second voltage level, wherein the first voltage level is higher than the second voltage level, wherein the detecting the voltage level comprises:
      filtering the clock signal using a low pass filter to produce a filtered clock signal; and
      comparing a clock line voltage of the filtered clock signal with a threshold voltage to produce a comparator output indicative of the detected voltage level, wherein a cutoff frequency of the low pass filter is set to a multiple of the first voltage level to prevent false detection of the first voltage level; and
   providing an output voltage on the data communication interface, the output voltage being at one of the first voltage level or the second voltage level corresponding to the detected voltage level.

10. The method of claim 9, wherein the first voltage level is 1.8 V and the second voltage level is 1.2 V.

11. The method of claim 9, further comprising:
selecting the first voltage level or the second voltage level based on the comparator output.

12. The method of claim 9, further comprising:
producing a clock level signal based on the comparator output; and
selecting one of the first voltage level or the second voltage level based on the clock level signal.

13. The method of claim 9, wherein the threshold voltage is between the first voltage level and the second voltage level.

14. The method of claim 13, wherein the threshold voltage is between 1.3 V and 1.4 V.

15. The method of claim 9, further comprising:
receiving a supply voltage at the first voltage level;
passing the supply voltage at the first voltage level as the output voltage in response to the detected voltage level being the first voltage level; and
regulating the supply voltage down to the second voltage level to provide the output voltage at the second voltage level to the data communication interface.

16. A slave device, comprising:
means for detecting a voltage level of a clock signal sent by a host device on a clock line of a data communication interface between the slave device and the host device, wherein the voltage level comprises a first voltage level or a second voltage level, wherein the first voltage level is higher than the second voltage level, wherein the means for detecting the voltage level comprises:
   means for filtering the clock signal using a low pass filter to produce a filtered clock signal; and
   means for comparing a clock line voltage of the filtered clock signal with a threshold voltage to produce a comparator output indicative of the detected voltage level, wherein a cutoff frequency of the low pass filter is set to a multiple of the first voltage level to prevent false detection of the first voltage level; and
means for providing an output voltage on the data communication interface, the output voltage being one of a first voltage level or a second voltage level corresponding to the detected voltage level.

17. The slave device of claim 16, wherein the first voltage level is 1.8 V and the second voltage level is 1.2 V.

18. The slave device of claim 16, further comprising:
means for selecting the first voltage level or the second voltage level based on the comparator output.

19. The slave device of claim 16, further comprising:
means for producing a clock level signal based on the comparator output; and
means for selecting one of the first voltage level or the second voltage level based on the clock level signal.

20. The slave device of claim 16, wherein the threshold voltage is between the first voltage level and the second voltage level.

21. The slave device of claim 20, wherein the threshold voltage is between 1.3 V and 1.4 V.

22. The slave device of claim 16, further comprising:
means for receiving a supply voltage at the first voltage level;
means for passing the supply voltage at the first voltage level as the output voltage in response to the detected voltage level being the first voltage level; and
means for regulating the supply voltage down to the second voltage level to provide the output voltage at the second voltage level to the data communication interface.

\* \* \* \* \*